United States Patent
Smith et al.

(10) Patent No.: US 6,990,012 B2
(45) Date of Patent: Jan. 24, 2006

(54) MAGNETIC MEMORY DEVICE

(75) Inventors: Kenneth Kay Smith, Boise, ID (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 105 days.

(21) Appl. No.: 10/680,464

(22) Filed: Oct. 7, 2003

(65) Prior Publication Data

US 2005/0073880 A1  Apr. 7, 2005

(51) Int. Cl.
*G11C 11/00* (2006.01)
(52) U.S. Cl. .................. 365/158; 365/232; 257/295
(58) Field of Classification Search .......... 257/17, 257/32, 295, 421, 422
See application file for complete search history.

(56) References Cited

U.S. PATENT DOCUMENTS

| | | | |
|---|---|---|---|
| 5,039,655 A | 8/1991 | Pisharody | |
| 5,732,016 A | 3/1998 | Chen et al. | |
| 5,956,267 A | 9/1999 | Hurst et al. | |
| 6,111,783 A | 8/2000 | Tran et al. | |
| 6,211,090 B1 * | 4/2001 | Durlam et al. | 438/692 |
| 6,236,590 B1 | 5/2001 | Bhattacharyya et al. | |
| 6,349,054 B1 * | 2/2002 | Hidaka | 365/173 |
| 6,404,674 B1 | 6/2002 | Anthony et al. | |
| 6,413,788 B1 | 7/2002 | Tuttle | |
| 6,417,561 B1 | 7/2002 | Tuttle | |
| 6,608,776 B2 * | 8/2003 | Hidaka | 365/171 |

* cited by examiner

*Primary Examiner*—Ngân V. Ngô
*Assistant Examiner*—Thinh T Nguyen

(57) ABSTRACT

The present invention provides a magnetic memory. In one embodiment, the magnetic memory includes a first line having a first cross-sectional area. A second line is provided having a second cross-sectional area different from the first cross-sectional area. A magnetic memory cell stack is positioned between the first line and the second line.

27 Claims, 4 Drawing Sheets

MAGNETIC MEMORY DEVICE

BACKGROUND OF THE INVENTION

One type of non-volatile memory known in the art relies on magnetic memory cells. These devices, known as magnetic random access memory (MRAM) devices, include an array of magnetic memory cells. The magnetic memory cells may be of different types. For example, a magnetic tunnel junction (MTJ) memory cell or a giant magnetoresistive (GMR) memory cell.

Generally, the magnetic memory cell includes a layer of magnetic film in which the orientation of magnetization is alterable and a layer of magnetic film in which the orientation of magnetization may be fixed or "pinned" in a particular direction. The magnetic film having alterable magnetization may be referred to as a sense layer or data storage layer and the magnetic film that is fixed may be referred to as a reference layer or pinned layer.

Conductive traces referred to as word lines and bit lines are routed across the array of memory cells. Word lines extend along rows of the memory cells and bit lines extend along columns of the memory cells. A memory cell stores a bit of information as an orientation of magnetization at each intersection of a word line and a bit line. The orientation of magnetization in the sense layer aligns along an axis of the sense layer that is commonly referred to as its easy axis. Magnetic fields are applied to flip the orientation of magnetization in the sense layer along its easy axis to either a parallel or anti-parallel orientation with respect to the orientation of magnetization in the reference layer.

The resistance through the sense layer and reference layer differs according to the parallel or anti-parallel orientation of magnetization. This resistance is highest when the orientation is anti-parallel, i.e., the logic "0" state, and lowest when the orientation is parallel, i.e., the logic "1" state. Thus, the state of the memory cell can be determined by sensing the resistance of the memory cell.

Conductive traces referred to as sense conductors are routed across the array of memory cells to aid in sensing the resistance of a memory cell. These sense conductors extend along columns of the memory cells and are electrically coupled to the magnetic layers of the memory cells. The word lines, which extend along rows of the memory cells, are electrically coupled to other magnetic layers of the memory cells. A memory cell is situated at each intersection of a sense conductor and a word line.

A read circuit is electrically coupled to the sense conductors and the word lines to read the state of a memory cell. During a read operation, the read circuit selects one sense conductor and one word line to determine the resistance and state of the memory cell situated at the conductors crossing point. The read circuit can supply a sense current that flows through the word line and the memory cell to the sense conductor and back to the read circuit, where a voltage is detected. This voltage is used to determine the resistance and state of the cell.

A write circuit is electrically coupled to the word lines and the bit lines to write a memory cell. The write circuit supplies write currents to a selected word line and bit line crossing a memory cell to change the state of the memory cell. These word and bit line write currents may be the same or different in magnitude. The write currents create magnetic fields that, when combined, switch the orientation of magnetization of the selected memory cell from parallel to anti-parallel or vice-versa.

During a write operation, the non-selected memory cells along the selected word and bit lines are referred to as "half-selected" memory cells. The orientation of magnetization of these half-selected memory cells must not change when the selected memory cell is altered. If inadvertent switching of half-selected memory cells takes place, the array is gradually erased. This results in an unreliable memory device that cannot be used in an integrated circuit or system.

The memory cell device is usually fabricated as part of an integrated circuit using thin film technology. As with any integrated circuit device, it is important to use as little space as possible. However, difficulties arise as packing densities increase. For example, the magnetic field strength required to write a memory cell increases as the cell size decreases. Additionally, current density increases as the width and thickness of the word and bit lines decrease. This leads to electro-migration problems in the write conductors requiring the use of reduced write currents. Reduced write currents result in reduced magnetic field strengths, making it even more difficult to write the smaller memory cells.

Increasing packing density also leads to increasing the possibility of cross talk between conducting write lines and adjacent memory cells. If this happens repeatedly, the stored magnetic field of the adjacent cells is eroded through magnetic domain creep and the information in the cell can be rendered unreadable.

SUMMARY

The present invention provides a magnetic memory. In one embodiment, the magnetic memory includes a first line having a first cross-sectional area. A second line is provided having a second cross-sectional area different from the first cross-sectional area. A magnetic memory cell stack is positioned between the first line and the second line.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
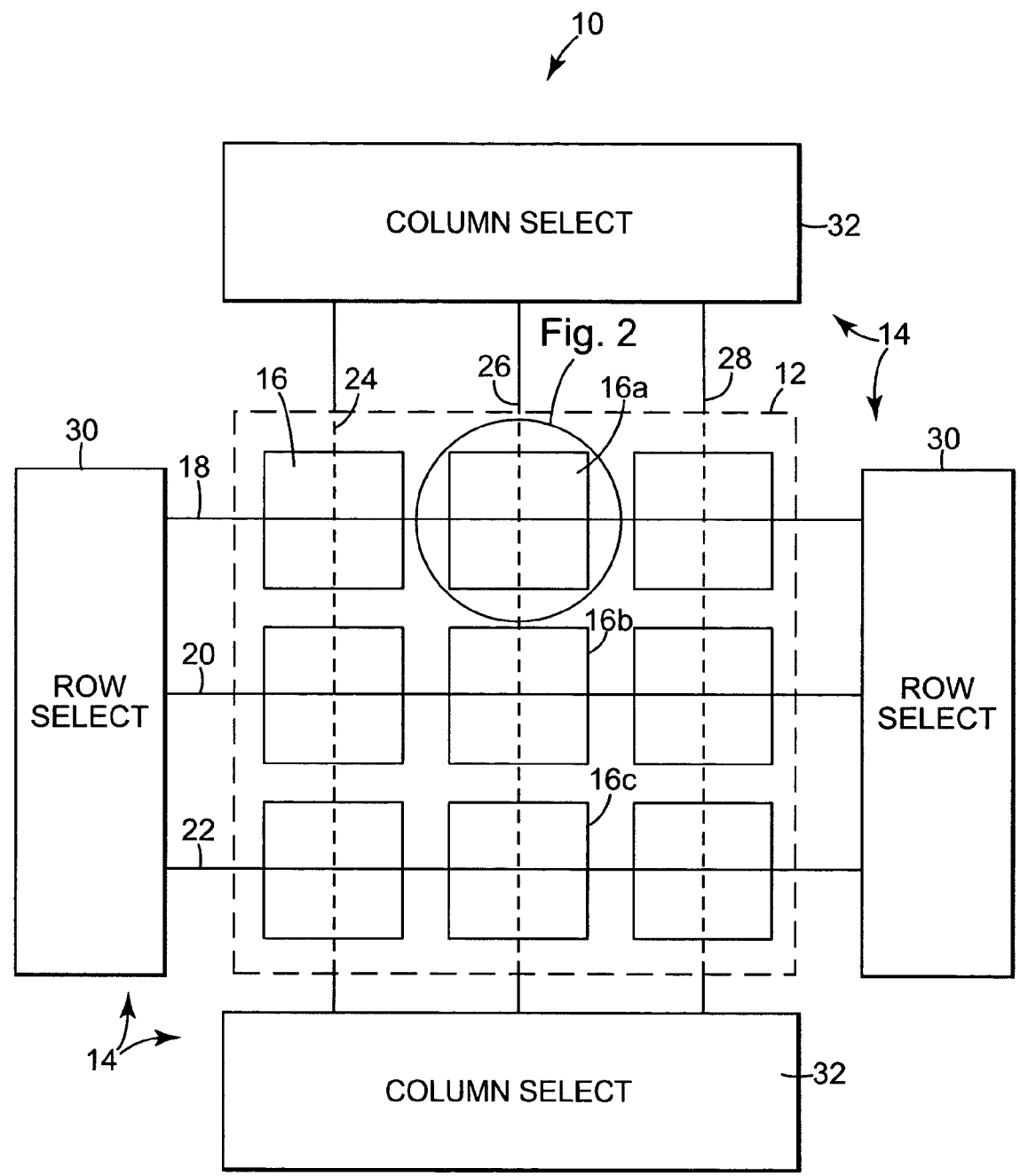
FIG. 1 is a block diagram illustrating of a magnetic memory device according to one exemplary embodiment of the present invention.

FIG. 1 is a block diagram illustrating a magnetic memory device 10 according to one exemplary embodiment of the present invention. The magnetic memory device 10 includes a magnetic memory cell array 12 electrically coupled to a write circuit 14 and a read circuit (not shown for clarity). Memory cell array 12 includes magnetic memory cells, indicated generally at 16. One or more memory cells 16 have a conductor with a relatively large cross-sectional area for increased current carrying capacity. In one aspect, each memory cell 16 includes a word line conductor having a first section and a second section. The first section has a larger cross-sectional area than the second section. During a write operation, a write current is passed through the conductor to generate a magnetic field for switching the state of a memory cell. The write current can be larger in magnitude due to the larger cross-sectional area of the word line conductor. This larger current generates a stronger magnetic field making it easier to write the memory cell. Exemplary embodiments of memory cells 16 according to an embodiment of the present invention are described in detail in this application.

Memory device 10 includes memory cell array 12 having a plurality of memory cells 16. The memory cells 16 are arranged in rows and columns, with the rows extending along an x-direction and the columns extending along a y-direction. Only a relatively small number of memory cells 16 are shown to simplify the illustration of the memory device 10. In practice, arrays of any size may be used.

Conductive traces functioning as word lines 18, 20 and 22 and bit lines 24, 26 and 28 extend across the array 12. Word lines 18, 20 and 22 extend along the x-direction in a plane on one side of the array 12 and bit lines 24, 26 and 28 extend along the y-direction in a plane on an opposing or opposite side of the array 12. There is one word line 18, 20 or 22 for each row of the array 12 and one bit line 24, 26 or 28 for each column of the array 12. Each memory cell 16 is located at a cross point of a word line 18, 20 or 22 and a bit line 24, 26 or 28.

The word lines 18, 20 and 22 and bit lines 24, 26 and 28 are electrically coupled to write circuit 14 for writing the memory cells 16. Write circuit 14 includes a row select circuit 30 electrically coupled to word lines 18, 20 and 22 and a column select circuit 32 electrically coupled to bit lines 24, 26 and 28. During a write operation, row select circuit 30 picks one word line 18, 20 or 22 and column select circuit 32 chooses one bit line 24, 26 or 28 for writing the state of the memory cell 16 situated at the selected word and bit line cross point. During this same write operation, row select circuit 30 supplies one write current to the selected word line 18, 20 or 22 and column select circuit 32 supplies a second write current to the selected bit line 24, 26 or 28. The magnetic fields generated by the currents going through word line 18, 20 or 22 and bit line 24, 26 and 28 set the orientation of magnetization in the selected memory cell 16.

Sense conductor lines (not shown for clarity) extend across array 12. These sense conductor lines extend along the y-direction in a plane on one side of array 12, and word lines 18, 20 and 22 extend along the x-direction in a plane on an opposing side of array 12. There is one sense conductor for each column of array 12. Each memory cell 16 is located at a cross point of a sense conductor line and a word line 18, 20 or 22. Word lines 18, 20 and 22 and sense conductor lines are electrically coupled to a read circuit (not shown) for sensing the resistance through memory cells 16.

During a read operation, the read circuit selects a sense conductor line and a word line 18, 20 or 22 for sensing the resistance through the memory cell 16 located at the cross point. The read circuit supplies a sense current that flows through the word line 18, 20 or 22 and memory cell 16 to the sense conductor and back to the read circuit, where a voltage is detected. The voltage is used to determine the resistance and state of the cell.

Figure 2:
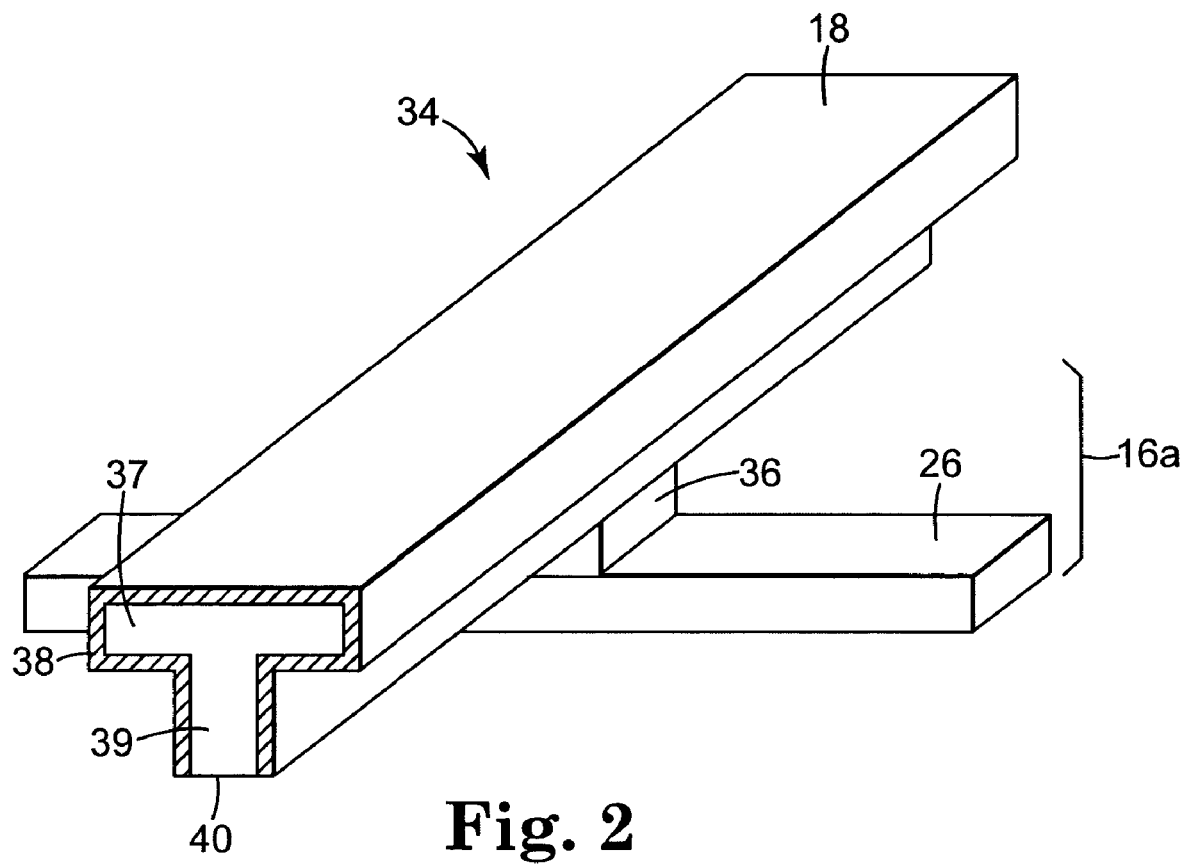
FIG. 2 is a perspective view illustrating a magnetic memory cell including a bit line and a word line, according to one exemplary embodiment of the present invention.

FIG. 2 is a diagram illustrating an exemplary embodiment of an array section 34. Array section 34 includes a magnetic memory cell 16a having a word line 18, a bit line 26 and a memory cell stack 36. The stack 36 is located between word line 18 and bit line 26. Word line 18 and bit line 26 are illustrated as essentially orthogonal to one another. However, word line 18 and bit line 26 may lie in other angular relations to one another.

Word line 18 has a relatively large cross-sectional area for increased current carrying capacity. In one aspect, word line 18 includes a first region 37 and a second region 39. First section 37 has a larger cross-sectional area than second region 39. Second region 39 is positioned adjacent memory cell stack 36. During a write operation, a write current is passed through the conductor to generate a magnetic field for switching the state of the memory cell. The write current can be larger in magnitude due to the larger cross-sectional area of the word line conductor.

Word line 18 includes a layer of cladding 38. Cladding 38 surrounds the perimeter of word line 18, except along the surface or side 40 located adjacent memory cell stack 36. Cladding 38 operates as a magnetic shield for word line 18. It is understood, that in another embodiment, the cladding 38 may completely surround the word line 18 such that the cladding 38 is only thinner at surface 40 of word line 18. Cladding 38 is made of a soft magnetic material, such as a ferromagnetic material. Other suitable cladding materials will become apparent to one skilled in the art after reading this specification.

During a write operation, the write current passing through the word line 18 generates a magnetic field, which is strong enough to establish an orientation of magnetization in the sense layer of memory cell stack 36. The cladding 38 contains the magnetic field on all sides of the word line 18, except along surface 40. Cladding 38 provides a closed magnetic path (flux closure) around the word line 18. Thus, the magnetic field is localized around the word line 18 and focused at surface 40 of the T-shaped word line 18 to alter the orientation of magnetization in memory cell stack 36.

In the present embodiment, memory cell stack 36 includes a sense layer, a barrier layer, a reference layer, a sense conductor and an insulating layer, (none of which are shown for clarity). The barrier layer is located between the sense layer and the reference layer. The sense conductor is electrically coupled to the reference layer and insulated from bit line 26 by the insulating layer. Word line 18 is electrically coupled to the sense layer. One example of a memory cell stack is disclosed in TA 7.3, titled Nonvolatile RAM based on Magnetic Tunnel Junction Elements, presented in Session 7 of the 2000 IEEE International Solid-State Circuits Conference in February of 2000, the disclosure incorporated herein by reference.

During a read operation, the read circuit selects the sense conductor and word line 18 for sensing the resistance through memory cell 16a located at the cross point. The read circuit supplies a sense current that flows through the word line 18 and memory cell 16a to the sense conductor and back to the read circuit, where a voltage is detected. The voltage is used to determine the resistance and state of memory cell 16a.

In other sense conductor configurations, such as the one disclosed in TA 7.3, titled Nonvolatile RAM based on Magnetic Tunnel Junction Elements and incorporated herein by reference, the sense conductors do not extend across the array. Instead, each memory cell has a sense conductor attached to an isolation transistor, which is turned on to read the selected memory cell.

In other embodiments, a four-conductor approach is taken where the word and bit lines are insulated from the sense layer and the reference layer. First and second sense conductors are electrically coupled to a read circuit and also electrically coupled to the sense layer and reference layer, respectively. Insulating layers are located between the word lines and sense conductors, and bit lines and the other sense conductors. The sense conductors are used to sense the resistance through memory cells, and the word and bit lines are used to write the memory cells. The present invention can be embodied in any of these alternative designs. Other embodiments will become apparent to one skilled in the art after reading this specification.

Figure 3:
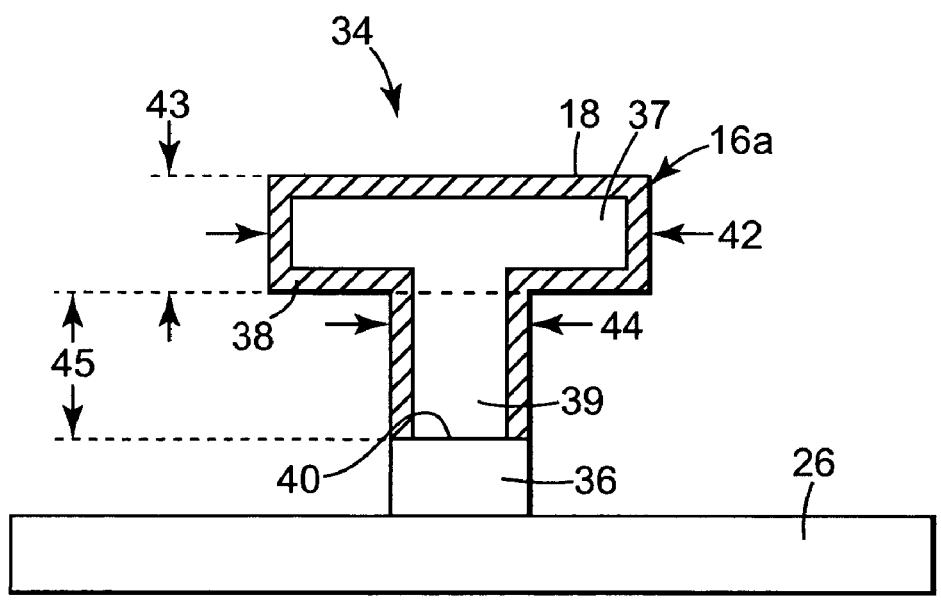
FIG. 3 is a cross-sectional diagram illustrating one exemplary embodiment of a magnetic memory cell having a memory cell stack positioned between a bit line and a word line, according to the present invention.

FIG. 3 is a diagram illustrating a cross section of one exemplary embodiment of array region 34 and memory cell 16a. Word line 18 is a generally T-shaped (or mushroom shaped) conductor. First region 37 and second region 39 are essentially rectangular in cross-section. First section 37 has a first width 42 and second section 39 has a second width 44. First width 42 is substantially wider than second width 44. Second section 39 is essentially as wide as the stack 36 and narrower than first section 37. In one aspect, first width 42 is about 1.5 to 3 times larger than second width 44. However, it is understood that in different embodiments of the invention, the stack 36, first section 37 and second section 39 may have different relative widths. It is also understood that in different embodiments of the invention, the word line 18 could have different cross-sectional shapes, such as a mushroom or a light bulb.

Word line 18 can carry a write current more reliably (i.e., provides a lower impedance to current flow) than a write line having a smaller cross-sectional area. Word line 18 has a total cross sectional area equal to the sum of the cross sectional areas of first section 37 and second section 39. This total cross sectional area is equal to first width 42 times height 43, plus second width 44 times height 45. In the present exemplary embodiment, the cross sectional area of first section 37 is greater than the cross sectional area of second section 39. Write conductors in other memory devices typically have a rectangular cross-section with width and height dimensions similar to those (44, 45) of the region 39 of the T-shaped region 34. In the present embodiment, bit line 26 has a cross sectional area equal to second section 39 or less. Word line 18 has a substantially larger cross sectional area than this, equal to the cross sectional area of second section 39 plus the cross sectional area of first section 37. Since resistance is inversely proportional to cross sectional area, the resistance of word line 18 is much less than the resistance of previous or other write lines. Also, assuming the same write current, the current density is less in word line 18 resulting in fewer electro-migration problems and higher reliability. In the alternative, higher write currents may be used through word line 18 to achieve a maximum current density and produce a stronger magnetic field. Word line 18 can carry write currents more easily and reliably than other write lines having smaller cross-sectional areas.

In the present embodiment, the write current passed through word line 18 is greater than the write current passed through bit line 26. It has been found that supplying larger currents to one write line, as compared to a second write line, increases the stability of half-selected memory cells while the orientation of magnetization of the selected memory cell is switched. Consequently, reliability of storing data in an MRAM device is increased. See U.S. Pat. No. 6,111,783, issued to Lung Tran and James Brug, entitled MRAM Device Including Write Circuit For Supplying Word And Bit Line Current Having Unequal Magnitudes, the disclosure of which is hereby incorporated by reference. The higher current passed through word line 18 as compared to bit line 26 increases the reliability of memory device 10.

The magnetic field produced by the current passed through word line 18 is largely contained within cladding 38 and localized around word line 18. Cladding 38 focuses the magnetic field along surface 40 and into the sense layer of memory stack 36. Also, first section 37 is distanced from stack 36 by second section 39 to further maintain the magnetic field away from adjacent memory cells 16 in array 12.

Figure 4:
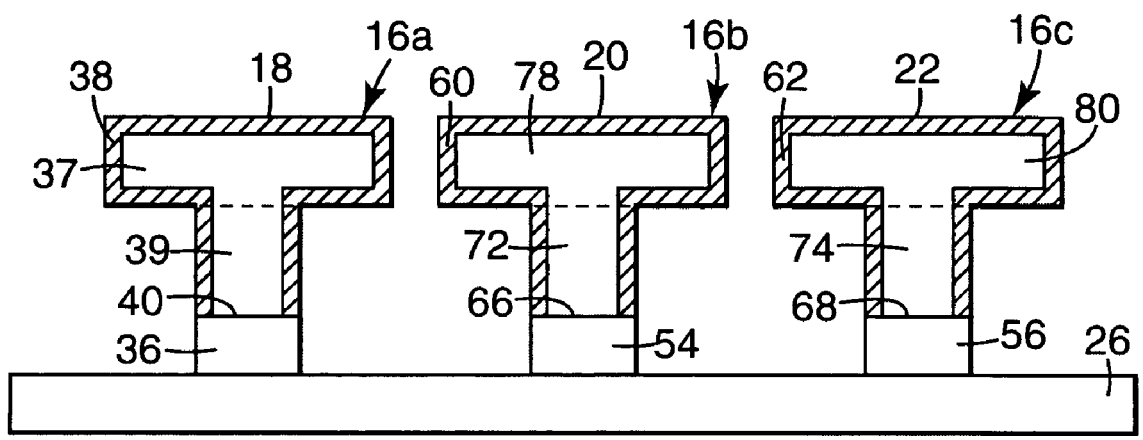
FIG. 4 is a diagram illustrating one exemplary embodiment of a magnetic memory cell array column having word lines in substantially the same plane, according to the present invention.

FIG. 4 is a diagram illustrating an exemplary embodiment of a column of memory cells 16a–16c in array 12. Memory cell 16a is described above and memory cells 16b and 16c are identical to memory cell 16a. Briefly, memory cells 16a–16c include memory cell stacks 36, 54 and 56 located between bit line 26 and word lines 18, 20 and 22. Word lines 18, 20 and 22 are each T-shaped conductors with cladding 38, 60 and 62 substantially around their perimeters, except along surfaces 40, 66 and 68. Word lines 18, 20 and 22 include first sections 37, 78 and 80 and second sections 39, 72 and 74. Second sections 39, 72 and 74 are located between stacks 36, 54 and 56 and first sections 37, 78 and 80. Surfaces 40, 66 and 68 are located next to sense layers in memory cell stacks 36, 54 and 56, which are next to bit line 26.

In this exemplary embodiment, the memory cells 16a–16c include first sections 37, 78 and 80 in substantially the same plane and next to each other. Isolation layers (not shown) separate first sections 37, 78 and 80 from one another. The width across memory cells 16a–16c is the sum of the widths of first sections 37, 78 and 80 plus the isolation layer widths. In this embodiment, bit lines 24, 26 and 28 in array 12 may be placed closer together than previously described embodiments to achieve a higher packing density.

In the present embodiment, a write operation for one memory cell 16b is similar to write operations for each memory cell 16 in array 12. To write memory cell 16b, a larger write current is passed through word line 20 and a smaller write current is passed through bit line 26. The larger write current produces a stronger magnetic field, which is localized around word line 20 and focused at surface 66 into stack 54 by cladding 60. The resulting magnetic fields switch the orientation of magnetization of the sense layer in memory cell stack 54.

The integrity of array 12 (i.e., the ability of array 12 to accurately read and write at a memory cell without affecting data stored at other locations within the memory array) is maintained during a write operation by using unequal write currents and by having a T-shaped word line 20 with cladding 60. The unequal write currents prevent half-selected memory cells from switching as previously described and referenced. Cladding 60 localizes the magnetic field around word line 20 to reduce the possibility of magnetic domain creep in neighboring memory cells, such as 16a and 16c. Also, since magnetic field strength drops off with distance from the origin, having first section 78 separated from array 12 by second section 72 reduces the possibility of magnetic domain creep. Thus, the integrity of the array 12 is maintained.

Figure 5:
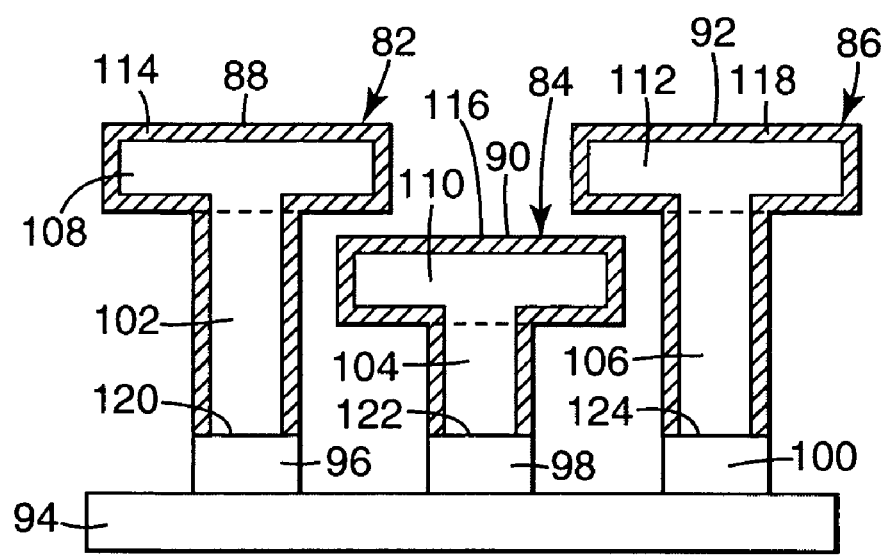
FIG. 5 is a diagram illustrating another exemplary embodiment of a magnetic memory cell array column having interleaved word lines, according to the present invention.

FIG. 5 is a diagram illustrating another exemplary embodiment of the present invention in another memory cell array having magnetic memory cells 82, 84 and 86. Memory cells 82, 84 and 86 include word lines 88, 90 and 92 next to memory cell stacks 96, 98 and 100, which are next to bit line 94. Word lines 88, 90 and 92 have second sections 102, 104 and 106 and first sections 108, 110 and 112 with cladding 114, 116 and 118 around the T-shaped conductors, except at surfaces 120, 122 and 124.

Word lines 88, 90 and 92 have first sections 108, 110 and 112 separated from stacks 96, 98 and 100 by second sections 102, 104 and 106. Stacks 96, 98 and 100 are next to second sections 102, 104 and 106 on one side and bit line 94 on an opposing side. Each of these memory cells 82, 84 and 86 are similar to memory cell 16a described above.

In this embodiment, the word lines 88, 90 and 92 are interleaved to achieve a higher packing density along bit line 94. This is accomplished by having second sections 102 and 106 the same height and taller than second section 104. The first sections 108 and 112 are in substantially the same plane and beyond first section 110. First sections 108 and 112 overlap the width of first section 110, but are isolated from first section 110. The spacing of memory cells 82, 84 and 86 is less than the spacing of the three first sections 108, 110 and 112 by the amount of overlap. In this manner, packing density is increased along bit line 94.

In this embodiment, a write operation for one memory cell 84 is similar to write operations for each memory cell in the array. To write memory cell 84, a large write current is passed through word line 90 and a smaller write current is passed through bit line 94. The large write current produces a strong magnetic field, which is localized around the word line 90 and focused at surface 122 into stack 98 by cladding 116. The resulting magnetic fields switch the orientation of magnetization of the sense layer in memory cell stack 98.

The integrity of the array is maintained during a write operation by using unequal write currents and by having a T-shaped word line 90 with cladding 116. The unequal write currents prevent half-selected memory cells from switching as previously described and referenced. The cladding 116 localizes the magnetic field around the word line 90 to reduce the possibility of magnetic domain creep in neighboring memory cells 82 and 86. Also, since magnetic field strength drops off with distance from the origin, having the first section 110 separated from the array by second section 104 reduces the possibility of magnetic domain creep. Thus, the integrity of the array is maintained.

Figure 6:
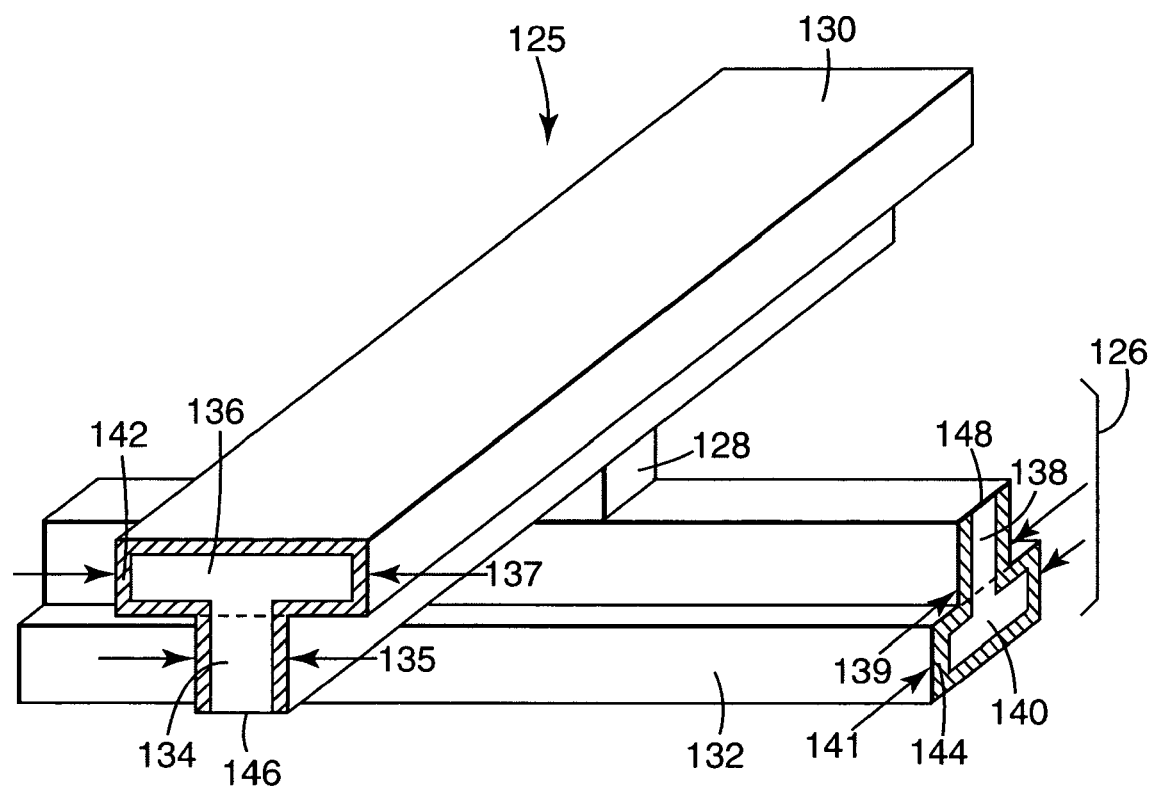
FIG. 6 is a perspective view illustrating another exemplary embodiment of a magnetic memory cell including a bit line and a word line, according to the present invention.

FIG. 6 is a perspective illustrating another embodiment of an array section 125 from another array. In this embodiment, array section 125 includes a magnetic memory cell 126 including a memory cell stack 128 located between a word line 130 and a bit line 132. Word line 130 and bit line 132 are illustrated as essentially orthogonal to one another. However, word line 130 and bit line 132 may lie in other angular relations to one another.

Word line 130 and bit line 132 are both T-shaped conductors with cladding. Word line 130 includes a second section 134 having a second width 135 and a first section 136 having a first width 137. Similarly, bit line 132 has a second section 138 having a fourth width 139 and a first section 140 having a third width 141. Stack 128 lies substantially along the second width 135 and fourth width 139 at surfaces 146 and 148. Word line 130 and bit line 132 also include cladding 142 and 144 around their perimeters, except at surfaces 146 and 148. Each of these write lines 130 and 132 are essentially the same as word line 18 described above.

Word line 130 and bit line 132 can carry larger currents for writing the sense layer of memory cell stack 128. This is due to the increased cross sectional area of word line 130 and bit line 132. Word line 130 has a cross sectional area equal to the second width 135 times the height of the second section 134, plus the first width 137 times the height of the first section 136. Similarly, bit line 132 has a cross sectional area equal to the fourth width 139 times the height of the second section 138, plus the third width 141 times the height of the first section 140. These cross sectional areas are larger than cross sectional areas of previous write conductors, which were essentially like second section 134 or 138, or smaller. The larger cross sectional areas allow word line 130 and bit line 132 to carry larger currents while maintaining the integrity of the array and avoiding problems such as electro-migration.

The word line 130 and bit line 132 also localize and focus the magnetic fields produced for writing the sense layer of memory cell stack 128. Cladding 142 and 144 localize the magnetic field around word line 130 and bit line 132. At the same time, cladding 142 and 144 focus the magnetic fields at surfaces 146 and 148 into memory cell stack 128. This makes it easier to write the sense layer of stack 128 and also prevents or reduces magnetic domain creep in adjacent cells.

During a write operation, write currents are passed through word line 130 and bit line 132 to alter the orientation of magnetization in the sense layer of stack 128. These write currents produce magnetic fields to write the sense layer of stack 128. The magnetic fields are localized and focused by the ferromagnetic cladding 142 and 144. Thus, memory cell 126 may be written more reliably and without causing inadvertent loss of data in neighboring cells.

The embodiment of FIG. 6 may have the word and bit lines 130 and 132 aligned in the various positions as illustrated in FIGS. 4 and 5. Thus, the word line 130 may have its first section 136 in the same plane as the first sections of neighboring word lines, as shown in FIG. 4, or the first sections may be interleaved, as shown in FIG. 5. Similarly, bit line 132 may have its first section 140 in the same plane as neighboring first sections, as shown in FIG. 4, or interleaved, as shown in FIG. 5. Also, any combination of planar and interleaved word lines 130 and bit lines 132 may be used.

What is claimed is:

1. A magnetic memory comprising:
   a first line having a first cross-sectional area;
   a second line having a second cross-sectional area different than the first cross-sectional area; and
   a magnetic memory cell stack positioned between the first line and the second line, wherein the first and second lines are T-shaped.

2. The memory of claim 1, where the first line is defined as a word line.

3. The memory of claim 1, where the first cross-sectional area is greater than the second cross-sectional area.

4. The memory of claim 1, where the first line further comprises:
   a first region having a first region cross-sectional area;
   a second region located adjacent the magnetic memory cell stack, the second region having a second region cross-sectional area, the second region cross-sectional area being smaller than the first region cross-sectional area.

5. The memory of claim 4, wherein the second region cross-sectional area is substantially similar to the second cross-sectional area.

6. The memory of claim 4, where the first region has a first width and the second region has a second width smaller than the first width.

7. The memory of claim 6, wherein the first region is substantially rectangular shaped, and the second region is substantially rectangular shaped.

8. A magnetic memory comprising:
a magnetic memory cell stack;
a first magnetic memory line for carrying a current, located adjacent the magnetic memory cell stack, the first magnetic memory line including a first region with a first width and a second region with a second width smaller than the first width; and
a second magnetic memory line for carrying a current, located adjacent the magnetic memory cell stack, the second magnetic memory line including a third region sized with the first width and a fourth region sized with the second width.

9. The magnetic memory of claim 8, wherein the first and second magnetic memory linen include at least a partial outer layer for localizing a magnetic field at the magnetic memory cell stack.

10. The magnetic memory of claim 9, wherein the outer layer is a cladding layer.

11. The magnetic memory of claim 8, wherein the first and second magnetic memory lines are substantially T-shaped.

12. A magnetic memory cell, comprising:
a first line having a first width and a second width, where the first width is greater than the second width;
a memory cell stack having a first side adjacent the first line along the second width; and
a second line having a third width and a fourth width, wherein the third width is greater than the fourth width and the memory cell stack is adjacent to second line along the fourth width.

13. The magnetic memory cell of claim 12, wherein the second width and the fourth width are the same as widths of the memory cell stack.

14. The magnetic memory cell of claim 12, wherein the second width is the same as the fourth width.

15. The magnetic memory cell of claim 12, further comprising mans for localizing and focusing magnetic fields produced by currents passed through the first line and the second line, where the magnetic fields are localized around the first line and the second line and focused into the memory cell stack.

16. The magnetic memory cell of claim 12, further comprising cladding around the first line and cladding around the second line, where the cladding is substantially away from between the first line and the memory cell stack and the second line and the memory cell stack.

17. The magnetic memory cell of claim 12, wherein the second width is the same as a width of the memory cell stack.

18. The magnetic memory cell of claim 12, further comprising means for localizing and focusing a magnetic field where the magnetic field is localized around the first line and focused into the memory cell stack.

19. The magnetic memory cell of claim 12, further comprising cladding around the first line and away from between the first line and the memory cell stack.

20. The magnetic memory cell of claim 12, wherein the first and second lines are T-shaped conductors.

21. A magnetic memory device, comprising:
an ray of magnetic memory cells;
first lines crossing the array of magnetic memory cells, the first lines having a first section and a second section where the first section is wider than the second section and
second lines crossing the array of magnetic memory cells, wherein the first and second lines have a T-shaped face.

22. The magnetic memory device of claim 21, wherein the first section is separated from the array of magnetic memory cells by the second section.

23. The magnetic memory device of claim 21, further comprising mesas for localizing and focusing a magnetic field, where the magnetic field is localized around each first line and focused into the array of magnetic memory cells.

24. The magnetic memory device of claim 21, wherein the first section of one first line is in substantially the same plane as the first section of an adjacent first line.

25. The magnetic memory device of claim 21, wherein the first section has a rectangular face and the second section has a rectangular face, the rectangular face of the first section and the rectangular face of the second section forming the T-shaped face.

26. The magnetic memory device of claim 21, wherein the first section of one first line is in substantially a different plane than the first section of an adjacent first line.

27. The magnetic memory device of claim 21, wherein the first lines and the second lines are orthogonal.

* * * * *